(12) United States Patent
Yokoyama et al.

(10) Patent No.: US 6,771,485 B2
(45) Date of Patent: Aug. 3, 2004

(54) CERAMIC ELECTRONIC DEVICE, PASTE COATING METHOD, AND PASTE COATING APPARATUS

(75) Inventors: Hideki Yokoyama, Akita-ken (JP); Atsushi Takeda, Akita-ken (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/378,976

(22) Filed: Mar. 5, 2003

(65) Prior Publication Data

US 2003/0169556 A1 Sep. 11, 2003

(30) Foreign Application Priority Data

Mar. 7, 2002 (JP) ........................................ 2002-062714

(51) Int. Cl.$^7$ ........................... H01G 4/228; H01G 4/06
(52) U.S. Cl. ...................................... 361/309; 361/311
(58) Field of Search ........................... 361/306.1–306.3, 361/308.1–308.3, 310–313, 301.3, 301.4, 320–321.1; 29/25.42; 338/21, 22 R, 22 SD

(56) References Cited

U.S. PATENT DOCUMENTS 5,162,973 A * 11/1992 Miyashita et al. ....... 361/308.1
6,104,599 A * 8/2000 Ahiko et al. ............. 361/306.3
6,195,248 B1 * 2/2001 Kunishi et al. ............. 361/305

FOREIGN PATENT DOCUMENTS

| JP | 4-151814 | * 5/1992 | ............ H01G/1/14 |
| JP | A 7-297075 | 11/1995 | |
| JP | A 10-57884 | 3/1998 | |
| JP | A 2000-138145 | 5/2000 | |

* cited by examiner

Primary Examiner—Dean A. Reichard
Assistant Examiner—Eric W. Thomas
(74) Attorney, Agent, or Firm—Oliff & Berridge, PLC

(57) ABSTRACT

A ceramic capacitor having a ceramic body and terminal electrodes, the ceramic body being substantially a rectangular parallelopiped in shape, the terminal electrodes being provided at the two ends of the ceramic body in the length direction, each terminal electrode being provided to cover one end face of the ceramic body in the length direction, part of the two surfaces in the width direction, and part of the two surfaces in the thickness direction, wherein, when the length of the ceramic body is L1 and the maximum lengths of the terminal electrodes at the two surfaces of the ceramic body in the width direction are L3 and L4, $0 \leq |(L4-L3)/L1| \leq 0.0227$ is satisfied. One surface among the two surfaces of the ceramic body in the width direction is the paste introduction side in the roller coating, while the other surface is the paste escape side in the roller coating.

13 Claims, 11 Drawing Sheets

CERAMIC ELECTRONIC DEVICE, PASTE COATING METHOD, AND PASTE COATING APPARATUS

BACKGROUND OF THE INVENTION

1. Field of the Invention

The present invention relates to a ceramic electronic device and to a paste coating method and paste coating apparatus used for production of that ceramic electronic device.

2. Description of the Related Art

In chip capacitors and other ceramic electronic devices, cap-shaped terminal electrodes are formed at the two end faces of the ceramic body. More particularly, each of these cap shaped terminal electrodes is formed to cover one end face of the ceramic body in the length direction, parts of the two surfaces of the body in the width direction, and parts of the two surfaces in the thickness direction.

To form such terminal electrodes, the general practice has been to use the method of dipping the ceramic body in a conductor paste or coating by a roller to coat a conductive paste on the two ends of the ceramic body and then dry the conductive paste by heat treatment to solidify it.

Terminal electrodes formed by conductive paste sometimes differ in the lengths of the parts formed on one surface in the width direction and the lengths of the parts formed on the other surface in the width direction due to the conditions under which the conductive paste is coated.

If soldering on such a ceramic electronic device, the contact areas between the terminal electrode and solder at the two surfaces in the width direction will end up differing. Therefore, the terminal electrode will receive stress of different magnitudes from the solder and the inconvenience of the phenomenon of the ceramic body standing up on its own (Manhattan phenomenon) etc. will arise.

SUMMARY OF THE INVENTION

An object of the present invention is to provide a ceramic electronic device able to avoid the Manhattan phenomenon of the ceramic body in the soldering process and a paste coating method and paste coating apparatus able to be used for production of such a ceramic electronic device.

To achieve the above object, according to a first object of the present invention, there is provided a ceramic electronic device having a ceramic body and terminal electrodes, wherein the ceramic body is substantially a rectangular parallelopiped in shape; the electrode terminals are provided at the two end sides of the ceramic body in the length direction, each of the terminal electrodes provided to cover one end face in the length direction of the ceramic body, part of the two surfaces in the width direction, and part of the two surfaces in the thickness direction; and, when the length of the ceramic body is L1 and the maximum lengths of the terminal electrodes at the two surfaces of the ceramic body in the width direction are L3 and L4, $0 \leq |L4-L3|/L1 \leq 0.0227$ (1/44) is satisfied.

Experiments of the present inventors revealed that if the ratio ($|L4-L3|/L1$) is set in a range from 0 to 0.0227, the rate of occurrence of the Manhattan phenomenon in the soldering process is kept low. Over the ratio $|L4-L3|/L1=0.0227$, the rate of occurrence of the Manhattan phenomenon tends to abruptly increase. Therefore, according to the ceramic electronic device of the present invention, it is possible to effectively suppress the Manhattan phenomenon and eliminate the phenomenon of the ceramic body standing up in the soldering process.

Preferably, the ceramic body has a plurality of internal electrodes, the plurality of internal electrodes being stacked inside the ceramic body in the thickness direction at intervals from each other and being connected to the terminal electrodes at one end surface each in the length direction. The effect of the present invention is particularly great in the case of a ceramic electronic device having such a ceramic body.

Preferably, each of the terminal electrodes is formed by coating a conductive paste on one end face of the ceramic body in the length direction by roller coating and heat treating it.

In this case, preferably one surface among the two surfaces of the ceramic body in the width direction is a paste introduction side in the roller coating, while the other surface is the paste escape side in the roller coating.

Preferably, the boundary shapes of the terminal electrodes formed at parts of the two surfaces of the ceramic body in the width direction are different. More preferably, the boundary shapes of the terminal electrodes formed at parts of the two surfaces of the ceramic body in the width direction are different, with one being a projecting type shape and the other being a recessed type shape. Alternatively, the boundary shapes of the terminal electrodes formed at parts of the two surfaces of the ceramic body in the thickness direction are inclined with respect to the end faces of the ceramic body in the length direction.

When forming a terminal electrode on one end face of the ceramic body in the length direction by roller coating, the boundary shape with the body of the terminal electrode easily becomes this shape. In this case, by applying the present invention, it is possible to effectively suppress the Manhattan phenomenon.

The surface of the terminal electrode may be formed with a plating film. This plating film may be a single layer or multiple layers.

According to a second aspect of the present invention, there is provided a paste coating method for forming terminal electrodes comprising the steps of rotating a roller coated with a conductive paste on its outer circumference and moving a ceramic body in substantially the same direction as the direction of rotation of the roller and bringing one end surface of the ceramic body into contact with the conductive paste present on the outer circumference of the roller to coat it with the conductive paste, wherein, when the speed of movement of the ceramic body is Vc and the peripheral speed of the roller at the circumference in contact with the one end surface of the ceramic body is Vp, the ratio Vp/Vc satisfies $0.95 \leq Vp/Vc \leq 0.98$.

In this case, the ceramic body preferably has a plurality of internal electrodes, the plurality of internal electrodes being stacked inside the ceramic body at intervals from each other and being exposed at one end surface each of the ceramic body.

Experiments of the present inventors confirmed that by setting the ratio Vp/Vc to a range of 0.95 to 0.98 and executing the paste coating method, it is possible to keep the ratio ($|L4-L3|/L1$) of the terminal electrodes formed in the range from 0 to 0.0227. If setting the ratio Vp/Vc larger than 0.98, the ratio ($|L4-L3|/L1$) of the terminal electrodes exceeds 0.0227. Further, even if setting the ratio Vp/Vc smaller than 0.95, the ratio ($|L4-L3|/L1$) of the terminal electrodes exceeds 0.0227.

By using the paste coating method of the present invention, it is possible to effectively produce the above-mentioned ceramic electronic device resistant to the Manhattan phenomenon.

According to a third aspect of the present invention, there is provided a paste coating apparatus including a paste coating roller for coating a paste for forming terminal electrodes and a ceramic body movement device, the roller being driven to rotate; the ceramic body movement device moving the ceramic body in substantially the same direction as the direction of rotation of the roller and bringing one end surface of the ceramic body into contact with paste present on the outer circumference of the roller; and, when the speed of movement of the ceramic body is Vc and the peripheral speed of the roller at the circumference in contact with the one surface of the ceramic body is Vp, the ratio Vp/Vc satisfies $0.95 \leq Vp/Vc \leq 0.98$.

This paste coating apparatus is used to coat a conductive paste on the outer circumference of the roller. It rotates the roller in this state and moves the ceramic body in substantially the same direction as the rotational direction of the roller. Further, it brings one end surface of the ceramic body into proximity with the outer circumference of the roller. Due to this, the conductive paste on the outer circumference of the roller is coated on that surface of the ceramic body. Therefore, the above paste coating method is realized and the above-mentioned ceramic electronic device according to the present invention is obtained.

Preferably, in the latter position of the direction of movement of the ceramic body with respect to the paste coating roller, a scrape-off roller is placed rotating in substantially the opposite direction to the direction of movement of the ceramic body for controlling the thickness of the paste coated on the one surface of the ceramic body.

By providing this scrape-off roller, it is possible to form a terminal electrode of a uniform predetermined thickness on one end surface of the ceramic body.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Preferred embodiments of the present invention will be described in detail below while referring to the attached figures.

Ceramic Electronic Device

Figure 1:
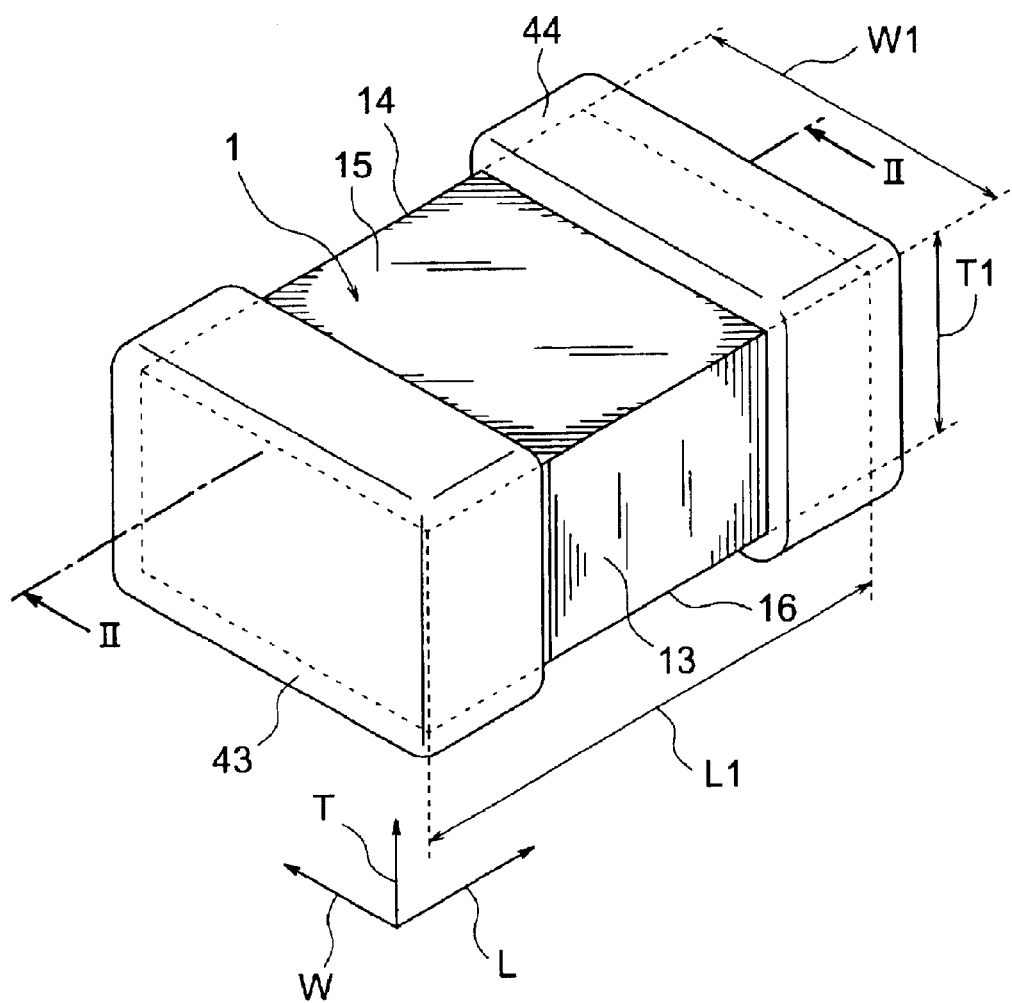
FIG. 1 is a perspective view of a ceramic electronic device according to an embodiment of the present invention.
Figure 2:
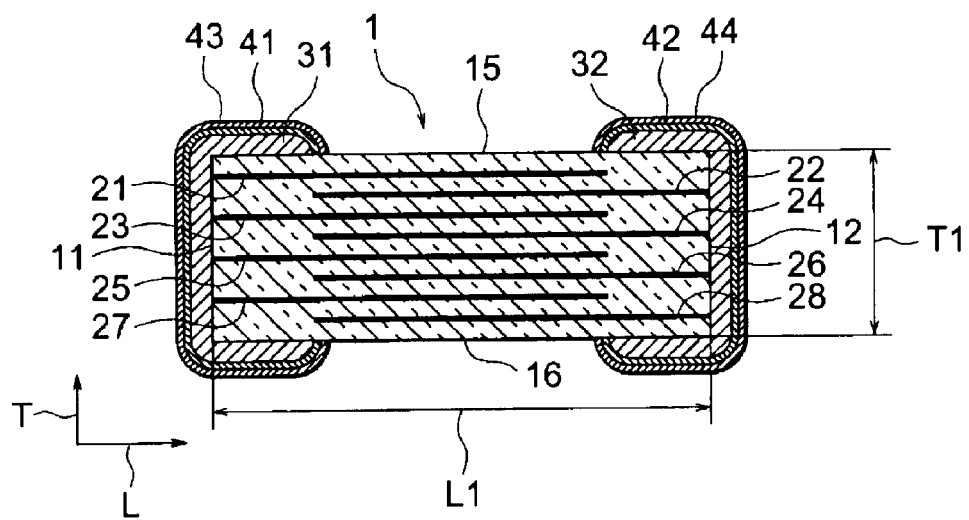
FIG. 2 is a cross-sectional view along the line II—II of FIG. 1.

As shown in FIG. 1 and FIG. 2, the ceramic electronic device according to an embodiment of the present invention has a ceramic body 1 and terminal electrodes 31 and 32. The "ceramic electronic device" includes a chip capacitor, chip inductor, chip varistor, or chip resistor or combinations of the same. Note that in the figures, a chip capacitor is shown as one example of a ceramic electronic device.

The ceramic body 1 is substantially a rectangular parallelepiped in shape. Note that the expression "rectangular parallelepiped" includes rectangular parallelepiped with rounded corners and rectangular parallelepiped which are chamfered. The length L1 along the length direction L of the ceramic body 1, the width W1 along the width direction W, and the thickness T1 along the thickness direction T may be any values. In the case of the illustrated embodiment, the values are as follows: length L1=2.0 mm, width W1=1.2 mm, and thickness T1=1.25 mm. As another example, they may be a length L1=4.4 mm, a width W1=3.1 mm, and a thickness T1=2.2 mm.

The relative magnitude of the length L1, width W1, and thickness T1 is length L1>width W1 and length L1>thickness T1. The ceramic body 1 may be formed from a known ceramic material selected in accordance with the type of the ceramic electronic device. Note that the length direction L is the direction in which the terminal electrodes are formed at the two ends of the ceramic body 1, while the thickness direction T is the direction in which the internal electrodes 21 to 28 shown in FIG. 2 and the dielectric layers formed between them are stacked. Further, the width direction W is the direction substantially perpendicular to both the length direction L and thickness direction T.

Referring to FIG. 2, the ceramic body 1 has a plurality of internal electrodes 21 to 28. The plurality of internal electrodes 21 to 28 are stacked inside the body in the thickness direction T via dielectric layers. In the present embodiment, the alternate internal electrodes 21, 23, 25, and 27 stacked via dielectric layers are connected to only one terminal electrode 31, while the other internal electrodes 22, 24, 26, and 28 are connected to only the other terminal electrode 32, so as to form a multilayer capacitor circuit. Note that the number of the internal electrodes 21 to 28 is not particularly limited in the present invention.

Figure 3:
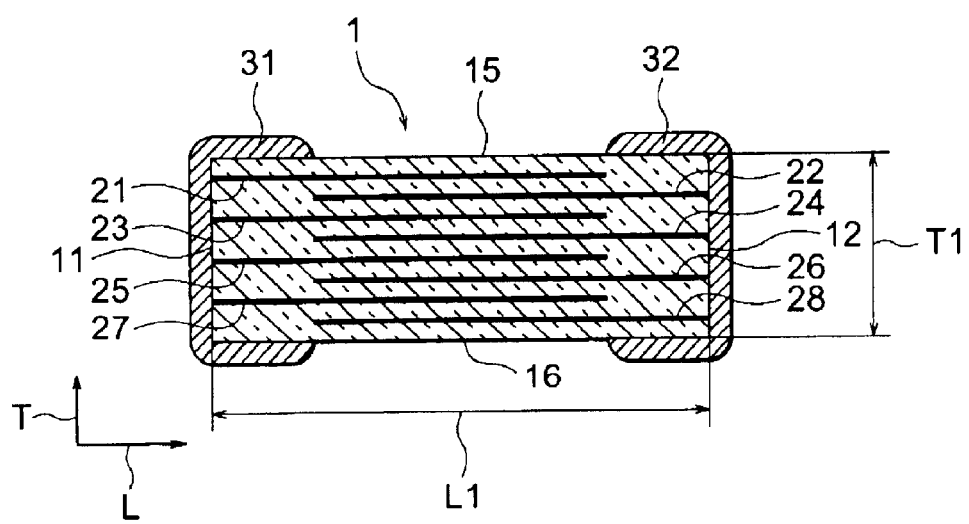
FIG. 3 is a cross-sectional view of an electronic device with terminal electrodes without the plating film shown in FIG. 2.

Referring to FIG. 3, the terminal electrodes 31 and 32 are provided at the two sides of the ceramic body 1 in the length direction L. Further referring to FIG. 4 to FIG. 6 as well, one terminal electrode 31 is provided so as to cover one end surface 11 of the body 1 in the length direction L, parts of the two surfaces 13 and 14 in the width direction W, and parts of the two surfaces 15 and 16 in the thickness direction T. The other terminal electrode 32 is provided so as to cover the other end surface 12 in the length direction L, parts of the two surfaces 13 and 14 in the width direction W, and parts of the two surfaces 15 and 16 in the thickness direction T.

Figure 4:
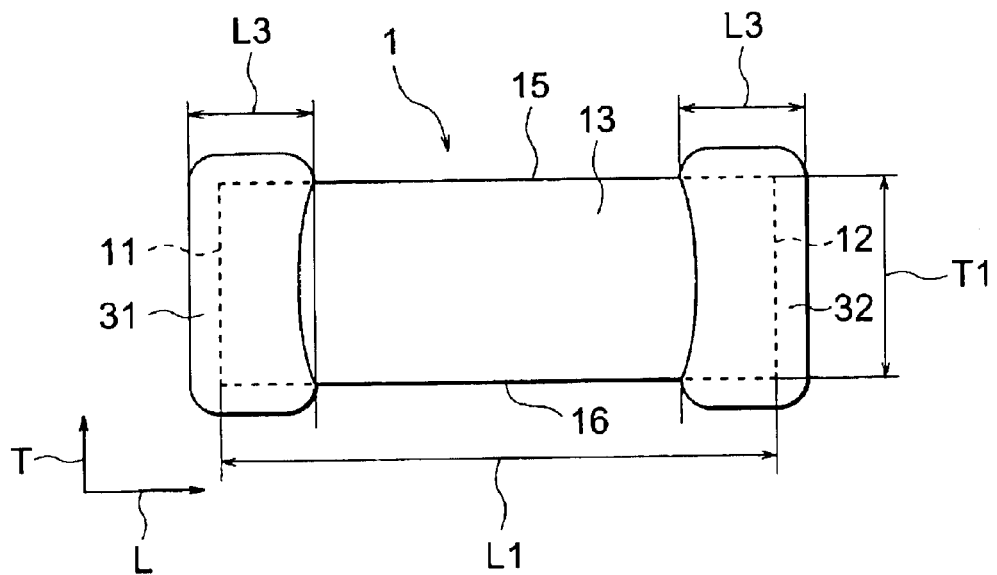
FIG. 4 is a front view of an electronic device with terminal electrodes without the plating film.
Figure 5:
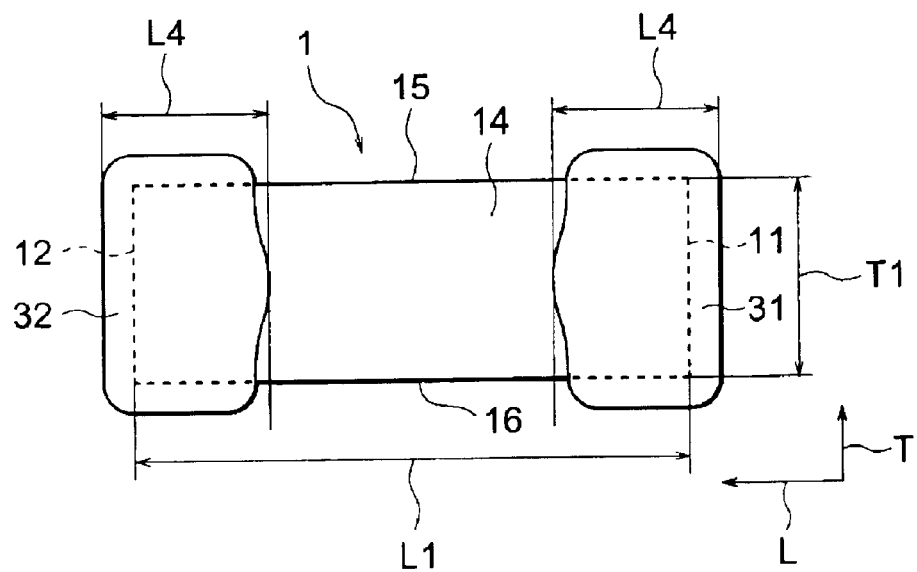
FIG. 5 is a back view of an electronic device with terminal electrodes without the plating film.
Figure 6:
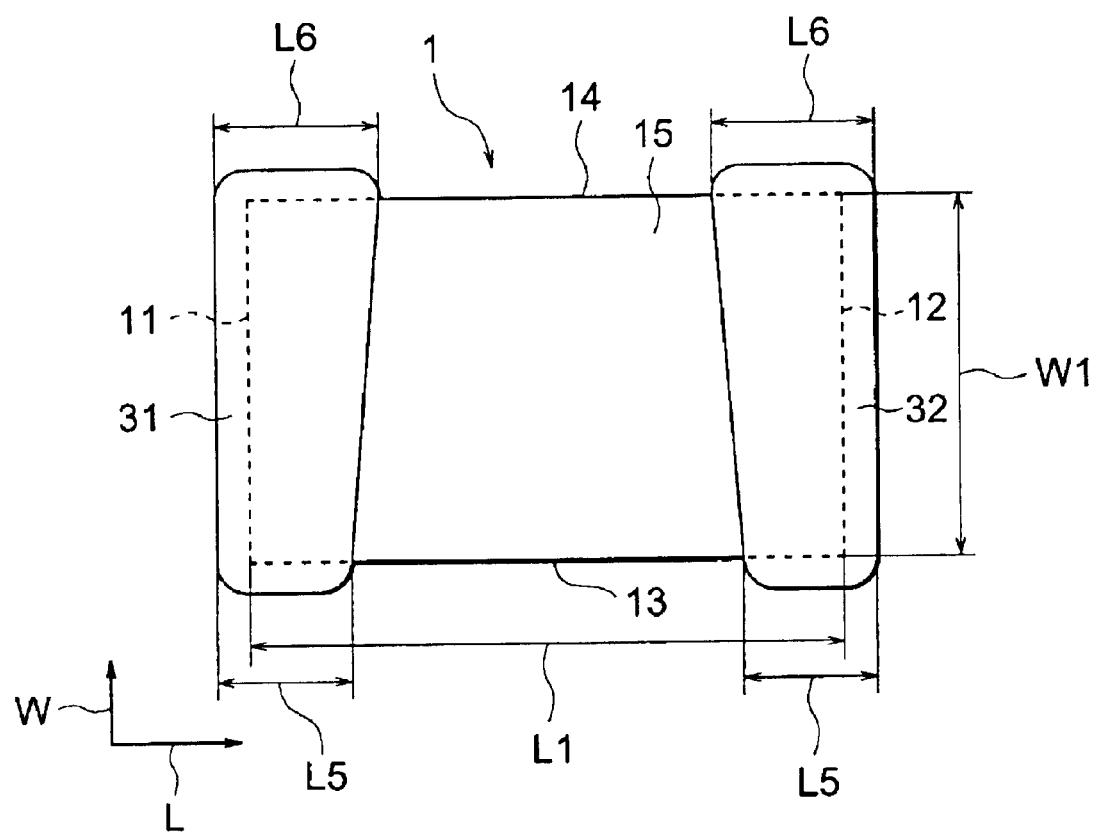
FIG. 6 is a plan view of an electronic device with terminal electrodes without the plating film.

Referring to FIG. 4, one terminal electrode 31 covers the part of the surface 13 in the width direction W near one end surface 11 in the length direction L. The other terminal electrode 32 covers the part of the surface 13 in the width direction W near the other end surface 12 in the length direction L. Note that the terminal electrodes 31 and 32 are difficult to form at uniform widths (length direction L of body 1) at the two ends of the ceramic body 1 in the length direction L. They sometimes become recessed as the center as shown in FIG. 4, project out at the center as shown in FIG. 5, or become asymmetric at the two sides as shown in FIG. 6. The paste coating method by the paste coating apparatus explained later has a large influence over such shapes.

In FIG. 4, the maximum length of the terminal electrodes 31 and 32 at the surface 13 in the width direction W is made L3. In FIG. 4, however, the boundary shapes of the terminal electrodes 31 and 32 are recessed shapes with recessed centers. The two side parts generally have maximum lengths of L3, but the parts of the maximum length L3 are not always there. The maximum lengths L3 of the terminal electrodes 31 and 32 should be the same when forming them under the same conditions by the later explained paste coating apparatus.

Referring to FIG. 5, one terminal electrode 31 covers the part of the other surface 14 in the width direction near one end surface 11 in the length direction L. The other terminal electrode 32 covers the part of the other surface 14 in the width direction W near the other end surface 12 in the length direction. The maximum length of the terminal electrodes 31 and 32 at the other surface 14 in the width direction W is made L4. Note that in FIG. 5, the terminal electrodes 31 and 32 have projecting boundary shapes with projecting centers. The center parts generally have the maximum lengths of L4, but the parts of the maximum length L4 are not always the centers. The maximum lengths L4 of the terminal electrodes 31 and 32 should be the same when forming them under the same conditions by the later explained paste coating apparatus.

Referring to FIG. 6, one terminal electrode 31 covers the part of the surface 15 in the thickness direction T near the end surface 11 in the length direction L. The other terminal electrode 32 covers the part of the surface 15 in the thickness direction T near the other end surface 12 in the length direction L. When viewed from the thickness direction T surface 15 side, the boundary shapes of the terminal electrodes 31 and 32 with the body are inclined with respect to the end faces 11 and 12. Further, the lengths of the terminal electrodes 31 and 32 on the surface 13 in the width direction W are made L5, while the lengths of the terminal electrodes 31 and 32 on the other surface 14 in the width direction W are made L6. In the present embodiment, the length L5 positioned at the surface 13 in the width direction W serving as the paste introduction side in the later explained roller coating is smaller than the length L6 positioned at the surface 14 in the width direction W serving as the paste escape side.

This length L5 often matches with the maximum length L3 shown in FIG. 4, but the length L6 is often shorter than the maximum length L4 shown in FIG. 5. Note that at the other surface 16 in the thickness direction T as well, the boundary shapes of the terminal electrodes 31 and 32 are similar to the boundary shapes of the terminal electrodes 31 and 32 at the surface 15.

Referring to FIG. 3, one terminal electrode 31 is connected to the internal electrodes 21, 23, 25, and 27 at one surface 11 of the ceramic body 1 in the length direction L. The other terminal electrode 32 is connected to the internal electrodes 22, 24, 26, and 28 at the other surface 12 of the ceramic body 1 in the length direction L.

The terminal electrodes 31 and 32 are electrodes baked on the ceramic body 1. These terminal electrodes 31 and 32 are obtained by coating a conductive paste on the ceramic body 1 and drying and solidifying the conductive paste by heat treatment.

Referring again to FIG. 1 and FIG. 2, the surfaces of the terminal electrodes 31 and 32 have plating films 41 and 42 deposited on them. Further, the surfaces of these plating films 41 and 42 have plating films 43 and 44 deposited on them. These plating films 41 to 44 are metal films of Cu, Ni, Sn, etc.

The lengths L3 and L4 of the terminal electrode 31 (see FIG. 4 and FIG. 5) are far larger than the thicknesses of the plating films 41 and 43 deposited on the surface of the terminal electrode 31. The thicknesses of the plating films 41 and 43 are substantially negligible. Similarly, the lengths L3 and L4 of the terminal electrode 32 are far larger than the thicknesses of the plating films 42 and 44 deposited on the surface of the terminal electrode 32 and the thicknesses of the plating films 42 and 44 are substantially negligible.

The important characteristic of the ceramic electronic device according to the present invention is that the length L1 of the ceramic body 1, the length L3 of the terminal electrodes 31 and 32 at the width direction W surface 13 side and the length L4 of the terminal electrodes 31 and 32 at the other width direction W surface 14 side satisfy $$0 \leq |L4-L3|/L1 \leq 0.0227(1/44) \qquad (1)$$

For example, if the length L1 of the ceramic body 1 is 2.0 mm, the above relation (1) becomes $0 \leq |L4-L3| \leq 0.046(1/22)$ mm <Experimental Data>

Next, experimental data will be explained. Five sample groups 1 to 5 of ceramic electronic devices of the above configuration changed progressively in the ratio ($|L4-L3|/L1$) of the terminal electrodes 31 and 32 were prepared. The sample groups 1 to 5 each included 100 samples. The ratios ($|L4-L3|/L1$) of the sample groups 1 to 5 were made 0.002(1/500), 0.011(1/91), 0.021(1/48), 0.031(1/32), and 0.041(1/24). These values, however, were mean values of the 100 samples included in the respective sample groups.

Next, soldering processes were applied to these sample groups 1 to 5 to investigate the occurrence of the Manhattan phenomenon. In the soldering processes, eutectic solder was used and the reflow temperature was made 240° C. The results are shown in the following Table 1.

TABLE 1

| Sample group no. | Ratio ($|L4 - L3|/L1$) (mean value) | No. of occurrences of Manhattan phenomenon |
|---|---|---|
| 1 | 0.002 | 0 |
| 2 | 0.011 | 1 |
| 3 | 0.021 | 0 |
| 4 | 0.031 | 5 |
| 5 | 0.041 | 4 |

Figure 7:
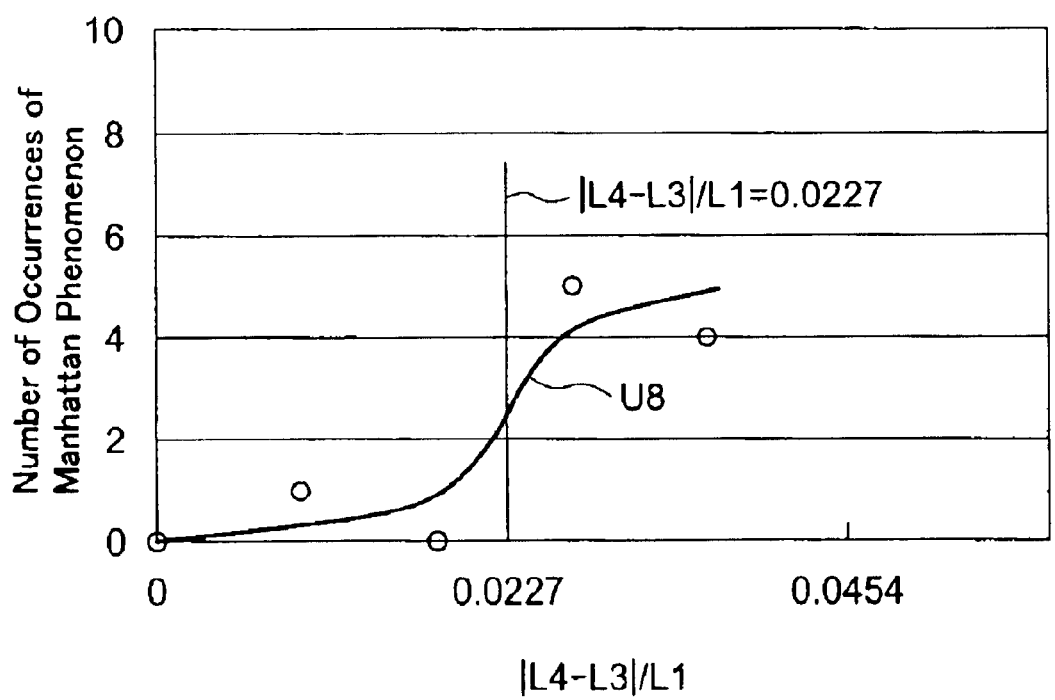
FIG. 7 is a graph of the number of occurrences of the Manhattan phenomenon with respect to the ratio ($|L4-L3|/L1$)

Next, the number of occurrences of the Manhattan phenomenon with respect to the ratio ($|L4-L3|/L1$) was graphed and approximated. The curve is shown by reference U8 in FIG. 7. Referring to this curve U8, in the range of the ratio ($|L4-L3|/L1$) from 0 to 0.0227, the number of occurrences of the Manhattan phenomenon in the soldering process is kept low. Over a ratio $|L4-L3|/L1=0.0227$, the number of occurrences of the Manhattan phenomenon abruptly increases.

Above, the case of application of the present invention to a chip capacitor as one type of ceramic electronic device was explained, but the present invention can also be applied to other types of ceramic electronic devices.

Paste Coating Method and Paste Coating Apparatus

Next, the paste coating method and paste coating apparatus used for production of the above ceramic electronic device will be explained.

Figure 8:
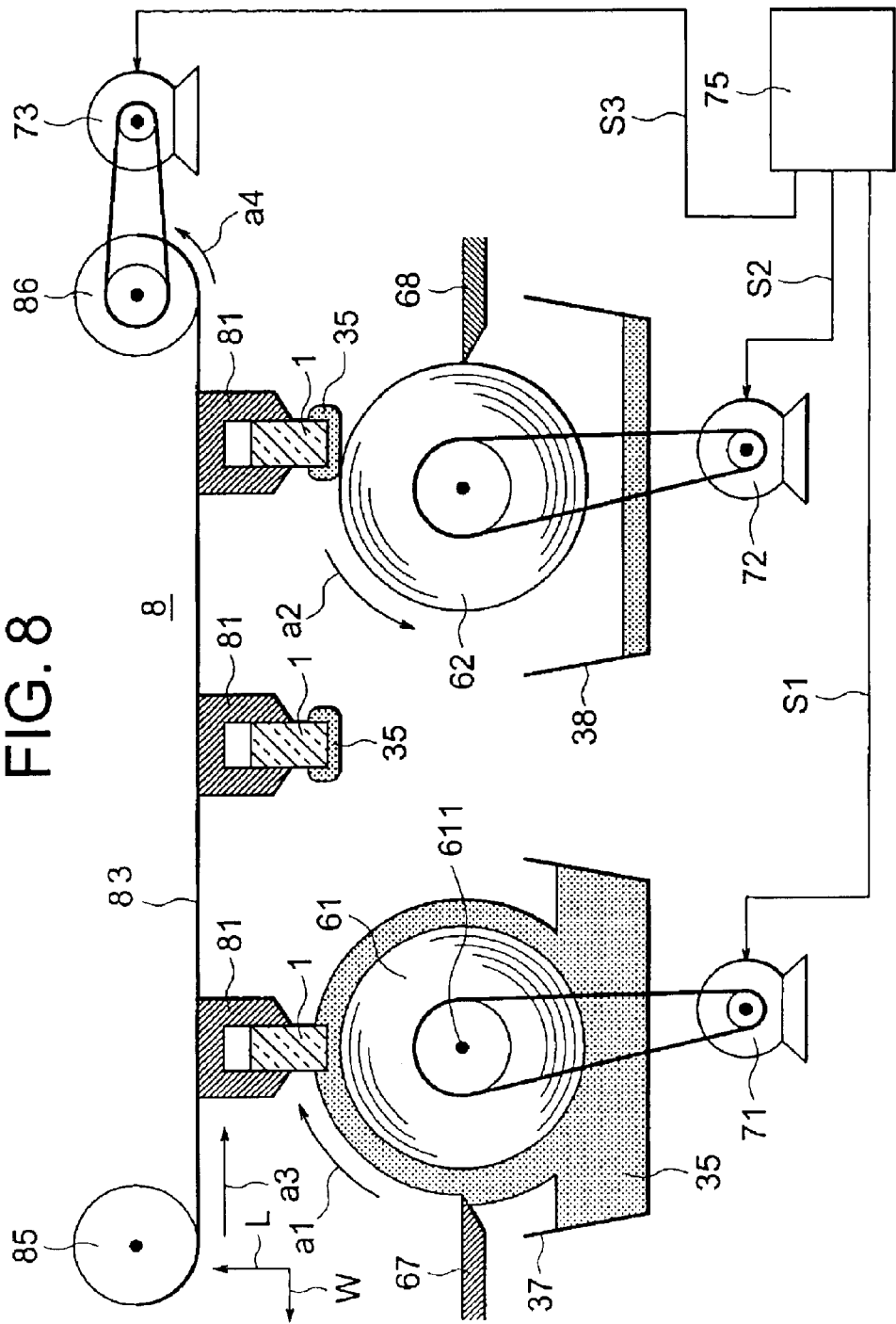
FIG. 8 is a schematic view of the configuration of a paste coating apparatus.

As shown in FIG. 8, the paste coating apparatus according to one embodiment of the present invention includes a paste coating roller 61 and a ceramic body movement device 8.

The roller 61 is driven to rotate in the direction indicated by the arrow a1 by a drive device 71. The outer circumference of the roller 61 is coated with a conductive paste 35. Specifically, the bottom of the roller 61 is immersed in the conductive paste 35 placed in a container 37. By driving the roller 61 to rotate, the outer circumference of the roller 61 is coated with the conductive paste 35. The conductive paste 35 is formed from a material having a known composition, viscosity, and electrical characteristics.

The roller 61 has a stationary squeegee 67 provided near it. The stationary squeegee 67 scrapes off the excess conductive paste 35 coated on the outer circumference of the roller 61 to ensure a uniform thickness of the conductive paste 35 coated on the outer circumference of the roller 61.

Figure 9:
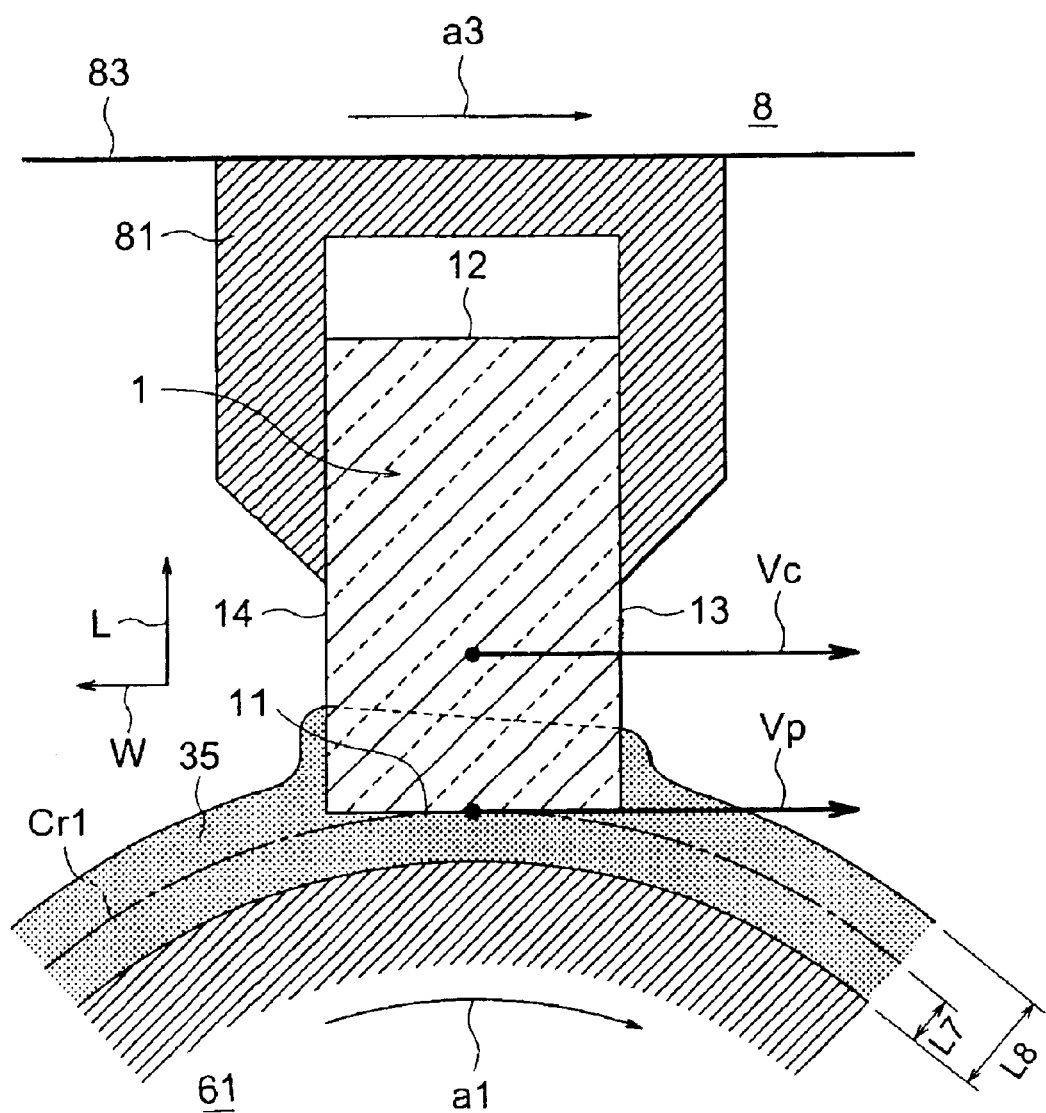
FIG. 9 is a partial enlarged cross-sectional view of the paste coating apparatus shown in FIG. 8.

As shown in FIG. 8 and FIG. 9, the ceramic body movement apparatus 8 moves the ceramic body 1 in the tangential direction a3 of the rotational direction a1 of the roller 61 to bring one surface 11 of the ceramic body 1 in the length direction L into proximity with the outer circumference of the roller 61. The ceramic body 1 is the same as the ceramic body 1 explained with reference to FIG. 1 and FIG. 2 and is in the state before formation of the terminal electrodes 31 and 32.

The movement direction a3 of the ceramic body 1 becomes substantially perpendicular to the shaft 611 of the roller 61. The ceramic body movement device 8 specifically has a belt 83 and guide roller 85 and 86.

The belt 83 is provided with a plurality of fasteners 81. These fasteners 81 are provided at intervals on the belt 83. ceramic bodies 1 are affixed to the belt 83 through these fasteners 81.

The belt 83 is stretched between the guide rollers 85 and 86. The guide roller 86 is driven to rotate in the direction indicated by the arrow a4 by a drive device 73. Due to this, the belt 83 travels in the direction of the arrow a3. The ceramic bodies 1 fastened to the belt 83 also are moved in the direction of the arrow a3.

Referring to FIG. 8, the paste coating apparatus is provided with a scraper roller 62. This scraper roller 62 is provided after the roller 61 in the direction of the arrow a3 and is driven to rotate in the direction a2 opposite to the movement direction a3 of the ceramic body 1 by a drive device 72. That is, the rotational direction a2 is reverse to the rotational direction a3. The scraper roller 62 is provided with a stationary squeegee 68. The stationary squeegee 68 serves to remove dirt from the outer circumference of the scrape-off roller 62.

The ceramic body movement device 8 brings the surface 11 of the ceramic body 1 into proximity with the roller 61 as explained above, then moves the ceramic body 1 in the direction a3 opposite to the rotational direction a2 of the scraper roller 62 and moves the surface 11 of the ceramic body 1 into proximity with the outer circumference of the scraper roller 62.

The paste coating apparatus is provided with a control device 75. The control device 75 gives a control signal S1 to the drive device 71 to control the rotation of the roller 61 through the drive device 71. Similarly, the control device 75 gives a control signal S2 to the drive device to control the rotation of the roller 62 through the drive device 72. Further, the control device 75 gives a control signal S3 to the drive device 73 to control the travel of the belt 83 through the drive device 73 and the guide roller 86.

Referring to FIG. 8 and FIG. 9, the apparatus rotates the roller 61 coated on its outer circumference with a conductive paste 35, moves the ceramic body 1 in the tangential direction a3 of the same direction as the rotational direction a1 of the roller 61, and brings the surface 11 of the ceramic body 1 in the length direction L into proximity with the outer circumference of the roller 61. Due to this, the conductive paste 35 on the outer circumference of the roller 61 is coated on and near the surface 11 of the ceramic body 1 in the length direction L. The one surface 13 among the two surfaces 13 and 14 of the ceramic body 1 in the width direction W becomes the paste introduction side, while the other surface 14 becomes the paste escape side (see FIG. 9).

As shown in FIG. 9, when the speed of movement of the ceramic body 1 is made Vc and the peripheral speed of the roller 61 as seen at the circumference Cr1 in contact with the surface 11 of the ceramic roller 1 is made Vp, to obtain the ceramic electronic device shown in FIG. 1 to FIG. 6, it is sufficient to set the ratio Vp/Vc of the roller 61 and ceramic body movement device 8 to satisfy:

$$0.95 \leq Vp/Vc \leq 0.98 \tag{2}$$

In the illustrated embodiment, the ratio Vp/Vc can be controlled by the control device 75.

Note that the circumference Cr1 shown in FIG. 9 is at a position of a distance L7 from the outer circumference of the roller 61 of preferably 0 to 0.8 mm. Further, the thickness L8 of the conductive paste 35 formed on the outer circumference of the roller 61 is a thickness of 3 to 12 times the distance L7.

Next, as explained with reference to FIG. 8, the apparatus rotates the scraper roller 62 in the direction indicated by the arrow a2, moves the ceramic body 1 in a direction a3 opposite to the rotational direction a2 of the scraper roller 62, and brings the surface 11 of the ceramic body 1 into proximity with the outer circumference of the scraper roller 62. Therefore, the excess portion of the conductive paste 35 formed on the surface 11 of the ceramic body 1 is scraped off from the outer circumference of the scraper roller 62 to a container 38.

Next, the conductive paste 35 coated on the surface 11 of the ceramic body 1 is dried and solidified by heat treatment. By applying a similar paste coating process and heat treatment to the opposite surface 12 of the ceramic body 1, the terminal electrodes 31 and 32 shown in FIG. 1 to FIG. 6 are obtained.

<Experimental Data>

Next, experimental data will be explained. In the above paste coating method, the speed of movement Vc of the ceramic body 1 was fixed and the peripheral speed Vp of the roller 61 as seen at the circumference Cr1 contacting the surface 11 of the ceramic body 1 was progressively changed (see following Table 2). Due to this, the ratio Vp/Vc was progressively changed. The result are shown as Numerical Value Examples 1 to 6.

TABLE 2

| Numerical value example no. | Speed of movement Vc of ceramic body 1 (mm/s) | Peripheral speed of outer circumference of roller 61 (mm/s) | Peripheral speed Vp of roller 61 seen at circumference Cr1 (mm/s) | Ratio Vp/Vc |
|---|---|---|---|---|
| 1 | 6.000 | 5.700 | 5.719 | 0.953 |
| 2 | 6.000 | 5.800 | 5.819 | 0.970 |
| 3 | 6.000 | 5.900 | 5.920 | 0.987 |
| 4 | 6.000 | 6.000 | 6.020 | 1.003 |
| 5 | 6.000 | 6.100 | 6.120 | 1.020 |
| 6 | 6.000 | 6.200 | 6.221 | 1.037 |

The peripheral speed Vp of the roller 61 as seen at the circumference Cr1 in contact with the surface 11 of the ceramic body 1 is found from the peripheral speed of the outer circumference of the roller 61. The distance L7 between the outer circumference of the roller 61 and the surface 11 of the ceramic body (see FIG. 9) was made 0.1 mm. Further, the thickness L8 of the conductive paste 35 coated on the outer circumference of the roller 61 was made 1.1 mm.

Using the paste coating method of each of Numerical Value Examples 1 to 6, conductive paste 35 was coated on and near the surface 11 of the ceramic body 1 in the length direction L. The length L1, width W1, and thickness T1 of the ceramic body 1 were made 2.0 mm, 1.2 mm, and 1.25 mm, respectively. Further, the composition and the viscosity of the conductive paste 35 were as follows:

<Paste Composition>

Metal ingredient: Ag 100%

Metal content: 73 wt %

Binder: acrylic-based resin

<Paste Viscosity>

1 rpm: 80 Pa.s 10 rpm: 35 Pa.s 100 rpm: 23 Pa.s

Here, the paste viscosity is the value measured by a BF viscosity meter.

Next, the coated conductive paste 35 was dried and solidified by heat treatment. Due to this, a sample provided with a terminal electrode 31 on the surface 11 of the ceramic body 1 was obtained. Five types of samples were obtained for each of the Numerical Value Examples 1 to 6.

Next, the length L3 of the terminal electrode 31 at the width direction W surface 13 side and the length L4 of the terminal electrode 31 at the width direction W surface 14 side were measured (see FIG. 4 and FIG. 5). Further, the length L5 of the terminal electrode 31 on the surface 13 in the width direction W and the length L6 of the terminal electrode 31 on the other surface 14 in the width direction W when seen from the thickness direction T surface 15 side were measured. The surface 13 is the paste introduction surface, while the surface 14 is the paste escape surface (see FIG. 9). The lengths L3 to L6 were measured by a projector.

Figure 10:
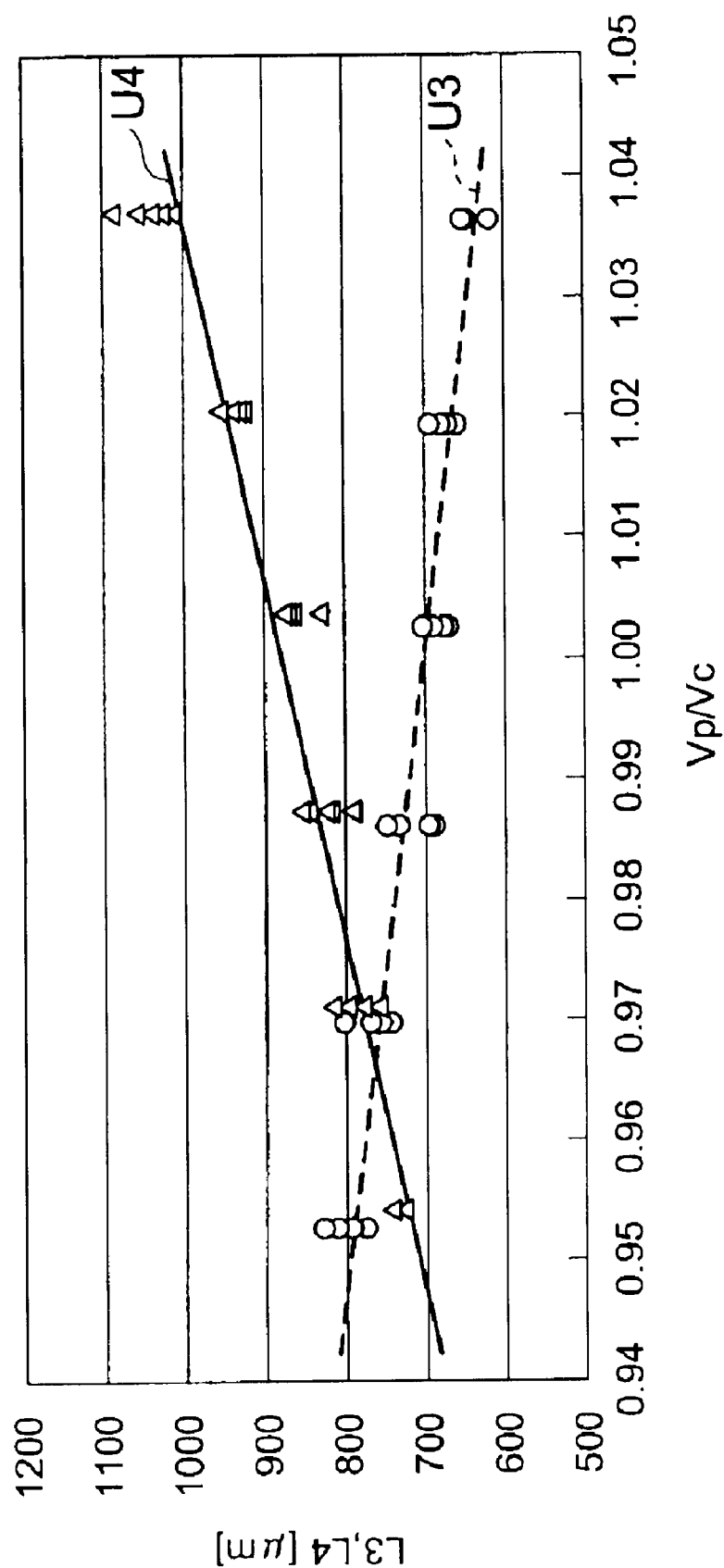
FIG. 10 is graph of lengths L3 and L4 of terminal electrodes with respect to the ratio Vp/Vc.

FIG. 10 is a graph of the lengths L3 and L4 of the terminal electrode 31 with respect to the ratio Vp/Vc. In the figure, the characteristic of the length L3 with respect to the ratio Vp/Vc and the characteristic of the length L4 with respect to the ratio Vp/Vc are shown by references U3 and U4, respectively. Referring to the characteristics U3 and U4, the larger the ratio Vp/Vc, the shorter the length L3 of the terminal electrode 31 on the paste introduction side surface 13 and the longer the length L4 of the terminal electrode 31 on the paste escape side surface 14.

Figure 11:
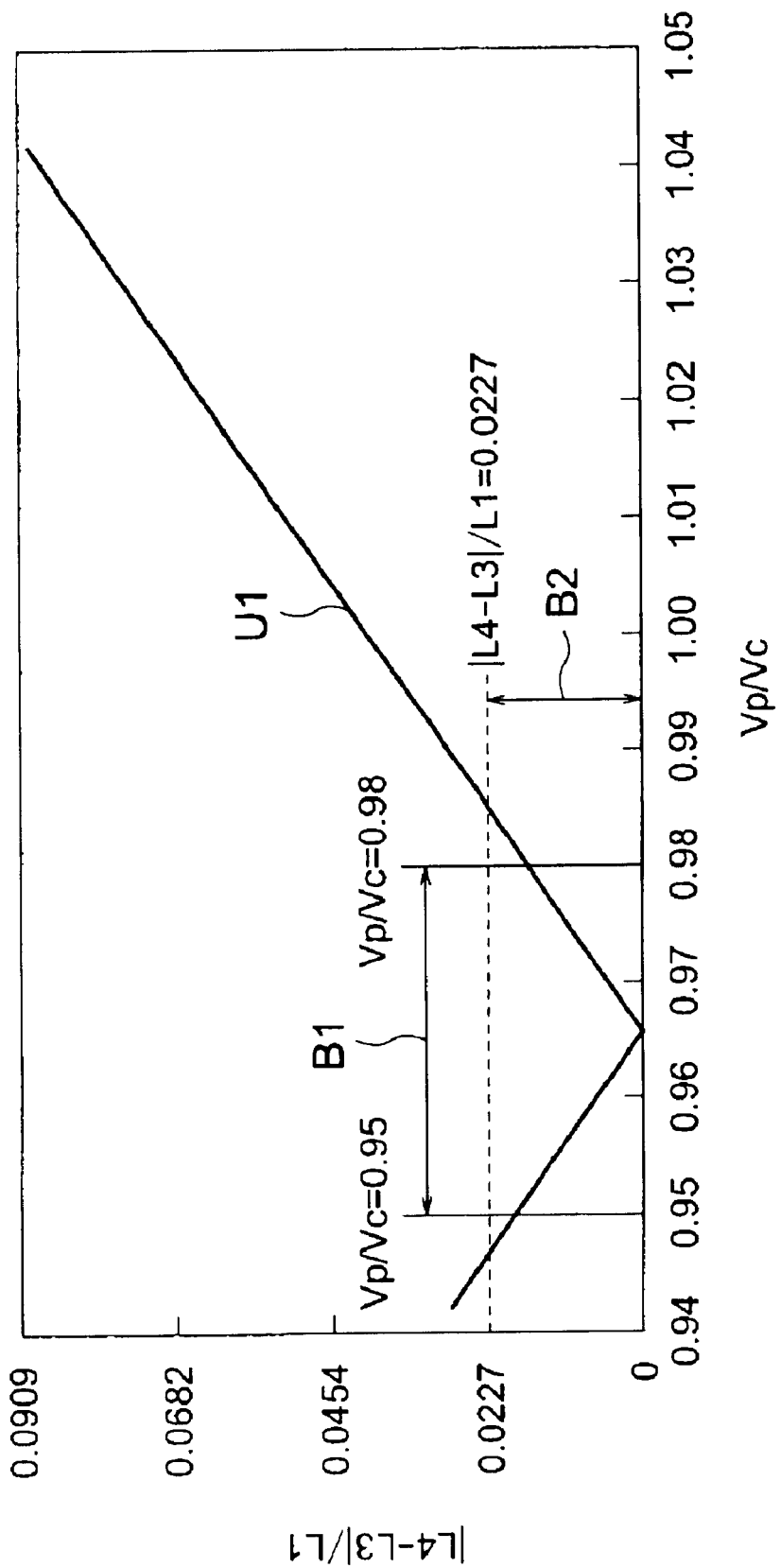
FIG. 11 is a graph of the characteristic of the ratio ($|L4-L3|/L1$) with respect to the ratio Vp/Vc.

FIG. 11 is a graph of the characteristic U1 of the ratio (|L4−L3|/L1) with respect to the ratio Vp/Vc. This characteristic U1 is found from the characteristics U3 and U4 shown in FIG. 10. In the range of the Vp/Vc of 0.96 or less, the smaller the ratio Vp/Vc, the greater the ratio (|L4−L3|/L1). When the ratio Vp/Vc becomes smaller than 0.95, the ratio (|L4−L3|/L1) exceeds 0.0227. Therefore, the lower limit of the ratio Vp/Vc was made 0.95.

Further, in the range of the Vp/Vc of 0.97 or more, the larger the ratio Vp/Vc, the greater the ratio (|L4−L3|/L1). When the ratio Vp/Vc becomes greater than 0.98, the ratio (|L4−L3|/L1) exceeds 0.0227. Therefore, the upper limit of the ratio Vp/Vc was made 0.98.

If the ratio Vp/Vc is set in a range B1 of $0.95 \leq Vp/Vp \leq 0.98$ in this way, it is possible to keep the ratio (|L4−L3|/L1) of the terminal electrode 31 within the range of $0 \leq (|L4-L3|/L1) \leq 0.0227$.

Figure 12:
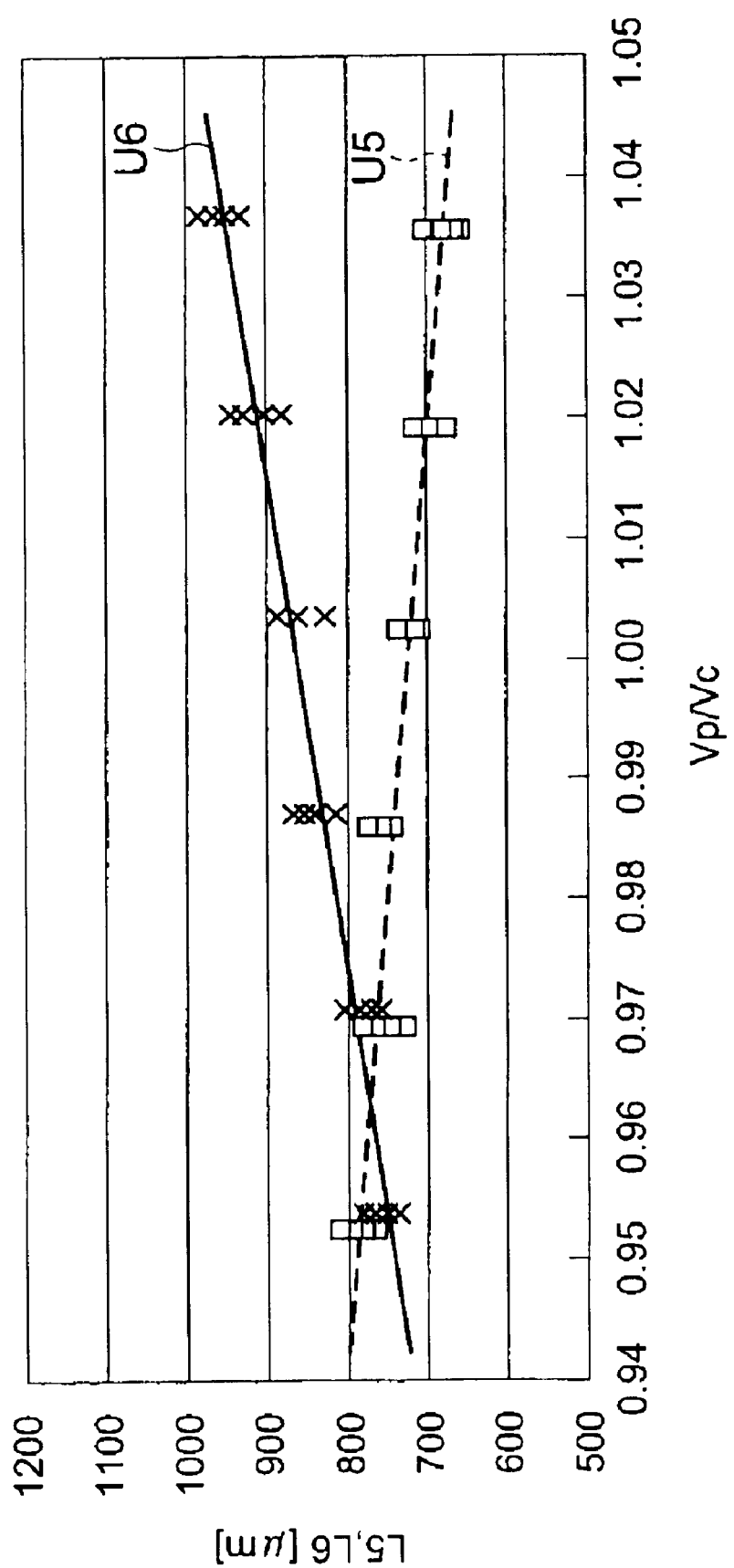
FIG. 12 is graph of lengths L5 and L6 of terminal electrodes with respect to the ratio Vp/Vc.

FIG. 12 is a graph of the lengths L5 and L6 of the terminal electrode 31 with respect to the ratio Vp/Vc. In the figure, the characteristic of the length L5 with respect to the ratio Vp/Vc and the characteristic of the length L6 with respect to the ratio Vp/Vc are shown by references U5 and U6, respectively.

Referring to the characteristics U5 and U6 shown in FIG. 12, the larger the ratio Vp/Vc, the shorter the length L5 of the terminal electrode 31 on the paste introduction side surface 13 when seen from the thickness direction T surface 15 side and the longer the length L6 of the terminal electrode 31 on the paste escape side surface 14.

Figure 13:
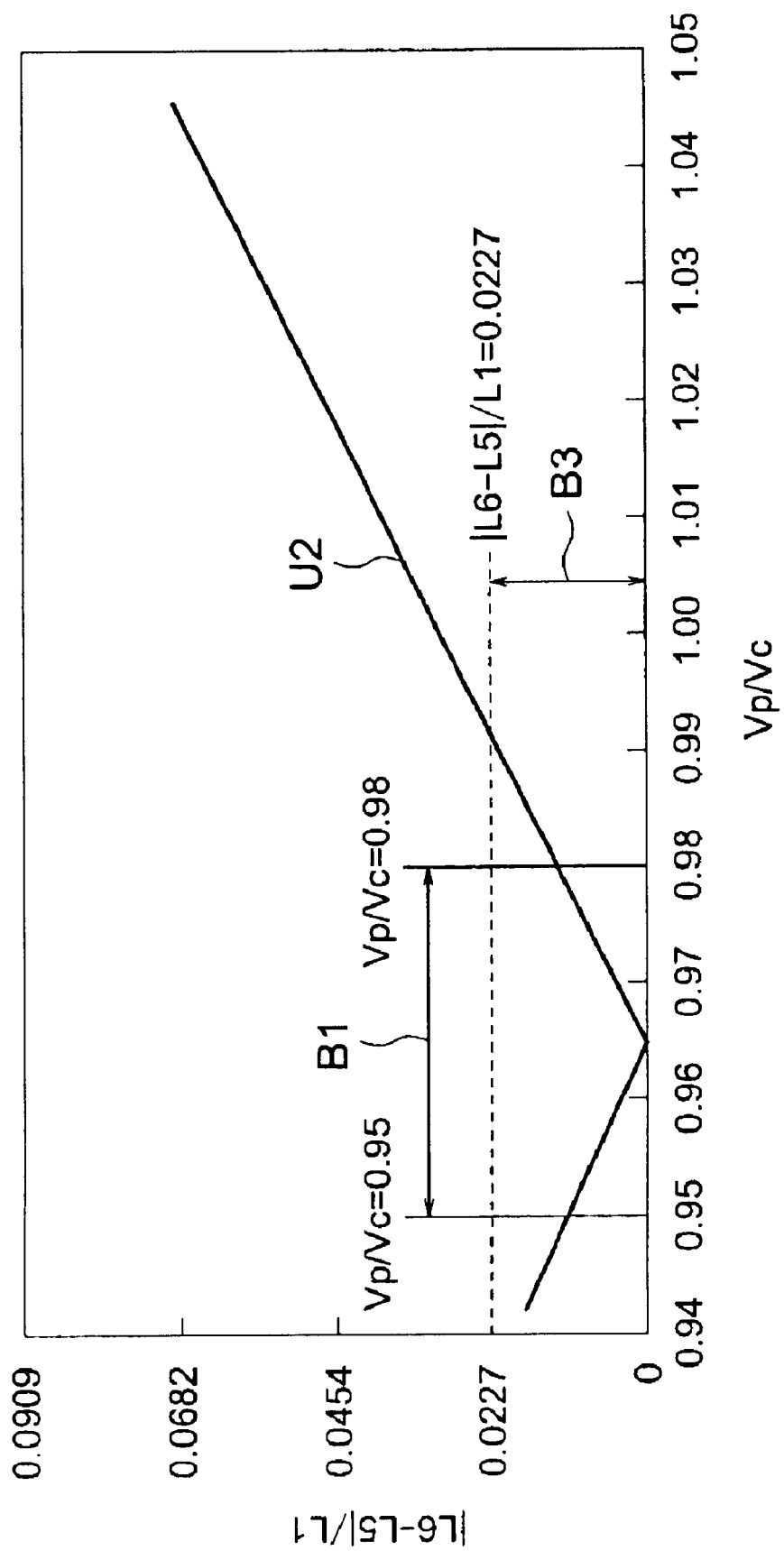
FIG. 13 is a graph of the characteristic of the ratio ($|L6-L5|/L1$) with respect to the ratio Vp/Vc.

FIG. 13 is a graph of the characteristic U2 of the ratio (|L6−L5|/L1) with respect to the ratio Vp/Vc. This characteristic U2 is found from the characteristics U5 and U6 shown in FIG. 12. If the ratio Vp/Vc is set in a range B1 of $0.95 \leq Vp/Vp \leq 0.98$, it is possible to keep the ratio (|L6−L5|/L1) of the terminal electrode 31 within the range B3 of $0 \leq (|L6-L5|/L1) \leq 0.0227$.

As explained above, according to the present invention, it is possible to provide a ceramic electronic device able to avoid the Manhattan phenomenon of the ceramic body in the soldering process and a paste coating method and paste coating apparatus able to be used for production of such a ceramic electronic device.

While the invention has been described with reference to specific embodiments chosen for purpose of illustration, it should be apparent that numerous modifications could be made thereto by those skilled in the art without departing from the basic concept and scope of the invention.

What is claimed is:

1. A ceramic electronic device having a ceramic body and terminal electrodes, wherein:

said ceramic body is substantially a rectangular parallelepiped in shave;

said electrode terminals are provided at the two end sides of said ceramic body in the length direction, each of the terminal electrodes provided to cover one end face in the length direction of said ceramic body, part of the two surfaces in the width direction, and part of the two surfaces in the thickness direction, wherein boundary shapes of said terminal electrodes formed at parts of the two surfaces of said ceramic body in the width direction are different; and when the length of said ceramic body is L1 and the maximum lengths of said terminal electrodes at the two surfaces of said ceramic body in the width direction are L3 and L4, $$0 \leq |L4-L3|/L1 \leq 0.0227$$

is satisfied.

2. The ceramic electronic device as set forth in claim 1, wherein:

said ceramic body has a plurality of internal electrodes, said plurality of internal electrodes being stacked inside said ceramic body in said thickness direction at intervals from each other and being connected to said terminal electrodes at one surface each in said length direction.

3. The ceramic electronic device as set forth in claim 1, wherein the boundary shapes of said terminal electrodes formed at parts of the two surfaces of said ceramic body in the width direction are different, with one being a projecting type shape and the other being a recessed type shape.

4. The ceramic electronic device as set forth in claim 1, wherein the surface of said terminal electrodes are formed with plating films.

5. The ceramic electronic device as set forth in claim 1, wherein each of said terminal electrodes is formed by coating a conductive paste on one end face of said ceramic body in the length direction by roller coating and heat treating the paste.

6. The ceramic electronic device as set forth in claim 5, wherein one surface among the two surfaces of said ceramic body in the width direction is a paste introduction side in the roller coating, while the other surface is the paste escape side in the roller coating.

7. A method of production of a ceramic electronic device as set forth in claim 1, using a paste coating method for forming terminal electrodes comprising the steps of:

rotating a roller coated with a conductive paste on its outer circumference and moving said ceramic body in substantially the same direction as the direction of rotation of said roller and bringing one end face of said ceramic body into contact with said conductive paste present on the outer circumference of said roller to coat the end face with said conductive paste, wherein, when a speed of movement of said ceramic body is Vc and a peripheral speed of said roller at the circumference in contact with said one end face of said ceramic body is Vp, the ratio Vp/Vc satisfies $$0.95 \leq Vp/Vc \leq 0.98.$$

8. A ceramic electronic device having a ceramic body and terminal electrodes, wherein:

said ceramic body is substantially a rectangular parallelepiped in shape;

said electrode terminals are provided at the two end sides of said ceramic body in the length direction, each of the terminal electrodes provided to cover one end face in the length direction of said ceramic body, part of the two surfaces in the width direction, and part of the two surfaces in the thickness direction, wherein boundary shapes of said terminal electrodes formed at parts of the two surfaces of said ceramic body in the thickness direction are inclined with respect to the end faces of said ceramic body in the length direction; and when the length of said ceramic body is L1 and the maximum lengths of said terminal electrodes at the two surfaces of said ceramic body in the width direction are L3 and L4, $$0 \leq |L4-L3|/L1 \leq 0.0227$$

is satisfied.

9. The ceramic electronic device as set forth in claim 8, wherein:

said ceramic body has a plurality of internal electrodes, said plurality of internal electrodes being stacked inside said ceramic body in said thickness direction at intervals from each other and being connected to said terminal electrodes at one surface each in said length direction.

10. The ceramic electronic device as set forth in claim 8, wherein the surface of said terminal electrodes are formed with plating films.

11. The ceramic electronic device as set forth in claim 8, wherein each of said terminal electrodes is formed by coating a conductive paste on one end face of said ceramic body in the length direction by roller coating and heat treating the paste.

12. The ceramic electronic device as set forth in claim 11, wherein one surface among the two surfaces of said ceramic body in the width direction is a paste introduction side in the roller coating, while the other surface is the paste escape side in the roller coating.

13. A method of production of a ceramic electronic device as set forth in claim 8, using a paste coating method for forming terminal electrodes comprising the steps of:

rotating a roller coated with a conductive paste on its outer circumference and moving said ceramic body in substantially the same direction as the direction of rotation of said roller and bringing one end face of said ceramic body into contact with said conductive paste present on the outer circumference of said roller to coat the end face with said conductive paste, wherein, when a speed of movement of said ceramic body is Vc and a peripheral speed of said roller at the circumference in contact with said one end face of said ceramic body is Vp, the ratio Vp/Vc satisfies $$0.95 \leq Vp/Vc \leq 0.98.$$

* * * * *